(12) United States Patent
Visser et al.

(10) Patent No.: US 7,714,986 B2
(45) Date of Patent: May 11, 2010

(54) LASER BEAM CONDITIONING SYSTEM COMPRISING MULTIPLE OPTICAL PATHS ALLOWING FOR DOSE CONTROL

(75) Inventors: Huibert Visser, Zevenhuizen (NL); Pieter Willem Herman De Jager, Rotterdam (NL); Henri Johannes Petrus Vink, Den Haag (NL); Marcus Gerhardus Hendrikus Meijerink, Den Haag (NL)

(73) Assignee: ASML Netherlands B.V., Veldhoven (NL)

( * ) Notice: Subject to any disclaimer, the term of this patent is extended or adjusted under 35 U.S.C. 154(b) by 593 days.

(21) Appl. No.: 11/753,390

(22) Filed: May 24, 2007

(65) Prior Publication Data

US 2008/0291417 A1 Nov. 27, 2008

(51) Int. Cl.
*G03B 27/54* (2006.01)
(52) U.S. Cl. ........................................................ 355/67
(58) Field of Classification Search ................... 355/67, 355/53, 69, 71
See application file for complete search history.

(56) References Cited

U.S. PATENT DOCUMENTS

| 5,229,872 | A | 7/1993 | Mumola |
| 5,296,891 | A | 3/1994 | Vogt et al. |
| 5,500,736 | A | 3/1996 | Koitabashi et al. |
| 5,523,193 | A | 6/1996 | Nelson |
| 5,530,482 | A | 6/1996 | Gove et al. |
| 5,579,147 | A | 11/1996 | Mori et al. |
| 5,677,703 | A | 10/1997 | Bhuva et al. |
| 5,808,797 | A | 9/1998 | Bloom et al. |
| 5,852,621 | A | 12/1998 | Sandstrom |
| 5,982,553 | A | 11/1999 | Bloom et al. |
| 6,133,986 | A | 10/2000 | Johnson |
| 6,177,980 | B1 | 1/2001 | Johnson |
| 6,275,514 | B1 | 8/2001 | Katzir et al. |
| 6,687,041 | B1 | 2/2004 | Sandstrom |
| 6,747,783 | B1 | 6/2004 | Sandstrom |
| 6,753,947 | B2 | 6/2004 | Meisburger et al. |
| 6,795,169 | B2 | 9/2004 | Tanaka et al. |
| 6,806,897 | B2 | 10/2004 | Kataoka et al. |
| 6,811,953 | B2 | 11/2004 | Hatada et al. |
| 2002/0153362 | A1 | 10/2002 | Sandstrom et al. |
| 2002/0186359 | A1 | 12/2002 | Meisburger et al. |
| 2004/0041104 | A1 | 3/2004 | Liebregts et al. |
| 2004/0130561 | A1 | 7/2004 | Jain |
| 2004/0239907 | A1 | 12/2004 | Hintersteiner et al. |
| 2005/0007572 | A1 | 1/2005 | George et al. |
| 2006/0055905 | A1 | 3/2006 | Baselmans et al. |
| 2007/0222961 | A1* | 9/2007 | Schmidt ...................... 355/69 |

FOREIGN PATENT DOCUMENTS

| EP | 0 266 203 A2 | 5/1988 |
| EP | 1 566 697 A2 | 8/2005 |
| WO | WO 98/33096 A1 | 7/1998 |
| WO | WO 98/38597 A2 | 9/1998 |
| WO | WO 98/38597 A3 | 9/1998 |
| WO | WO 2007/053335 A2 | 5/2007 |

OTHER PUBLICATIONS

International Search Report and Written Opinion for Application No. PCT/EP2008/003956 mailed Sep. 15, 2008, 11 pgs.

* cited by examiner

*Primary Examiner*—Peter B Kim
(74) *Attorney, Agent, or Firm*—Sterne, Kessler, Goldstein & Fox P.L.L.C.

(57) ABSTRACT

A radiation beam conditioning system comprising at least three optical paths in which the radiation is conditioned.

15 Claims, 4 Drawing Sheets

LASER BEAM CONDITIONING SYSTEM COMPRISING MULTIPLE OPTICAL PATHS ALLOWING FOR DOSE CONTROL

BACKGROUND

1. Field of the Invention

The present invention relates to a radiation beam conditioning system for use in a lithographic apparatus, a lithographic apparatus, and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can be a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In lithography, it is common to provide a variety of components between a radiation source and the so-called illuminator in order to condition the beam of radiation. In particular, it is desirable to improve the radiation uniformity across the beam, reduce the speckle within the radiation beam and, in the case of a pulsed radiation source, adjust the width of a pulse, e.g., its duration, and, in some cases, the radiation dose within the pulse. In general, it is necessary to ensure that the dose of radiation received at a substrate is close to a desired level because variations in the dose have a significance impact on the so-called critical dimension (CD) uniformity. In a lithography apparatus using a mask, the control of the dose within a single pulse of radiation is typically not critical because many pulses, for example 100, may be used in order to image a part of a pattern onto a substrate. Accordingly, variations in the energy within the pulses tend to become averaged out. However, in maskless lithography, control of the energy within each pulse is more important because far fewer pulses of radiation, for example only a single pulse, are used to image each part of the pattern onto the substrate. Therefore, it has previously been proposed for maskless lithographic apparatus to provide a component that can trim each pulse of radiation, such that the total energy in each pulse of radiation is reduced to a predetermined level.

However, in all lithographic apparatus, it is necessary to avoid wastage of the radiation provided by the radiation source because the speed at which the lithographic apparatus can image a pattern on the substrate is limited by the intensity of the radiation that can be imaged onto the substrate. Accordingly, it is necessary to reduce the wastage of the radiation in order to maximize the throughput of the lithographic apparatus. However, the inclusion of a plurality of components in order to condition the beam of radiation reduces the efficiency of the system because, in general, each component will not be perfectly transmissive, and accordingly, some of the energy of the beam of radiation will be wasted as it passes through each component.

Therefore, what is needed is a system and method that permit a conditioning of a beam of radiation with minimal wastage of a beam of radiation.

SUMMARY

In one embodiment of the present invention, there is provided a radiation beam conditioning system, configured to condition a pulsed beam of radiation for use in a lithographic apparatus, the radiation beam conditioning system comprising a radiation beam divider, a radiation beam combiner, and a radiation beam pulse trimmer. The a radiation beam divider is configured to divide the pulsed beam of radiation into at least first, second and third optical paths, such that each pulse of radiation is divided between the optical paths. The radiation beam combiner is configured to re-combine the pulses of radiation within the optical paths to output a single pulsed beam of radiation. The radiation pulse trimmer is configured to trim pulses of radiation within the first optical path. The radiation pulse trimmer is configured to trim a pulse of radiation within the first optical path, such that the total energy of a pulse of radiation output by the radiation beam combiner is substantially a predetermined level. The optical path lengths of the first, second and third optical paths, between the radiation beam divider and the radiation beam combiner, are different.

There is also provided a lithographic apparatus comprising such a radiation beam conditioning system.

In an embodiment, there is provided a device manufacturing method, comprising conditioning a pulsed beam of radiation for use in imaging a pattern onto a substrate; the conditioning comprising the following steps. Dividing the pulsed beam of radiation into at least first, second and third optical paths, such that each pulse of radiation is divided between the optical paths. Trimming pulses of radiation within the first optical path. Re-combining the pulses of radiation within the optical paths to output a single pulsed beam of radiation. The pulse of radiation within the first optical path is trimmed, such that the total energy of an output pulse of radiation is substantially a predetermined level. The optical path lengths of the first, second and third optical paths, between the radiation beam being divided and re-combined, are different.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
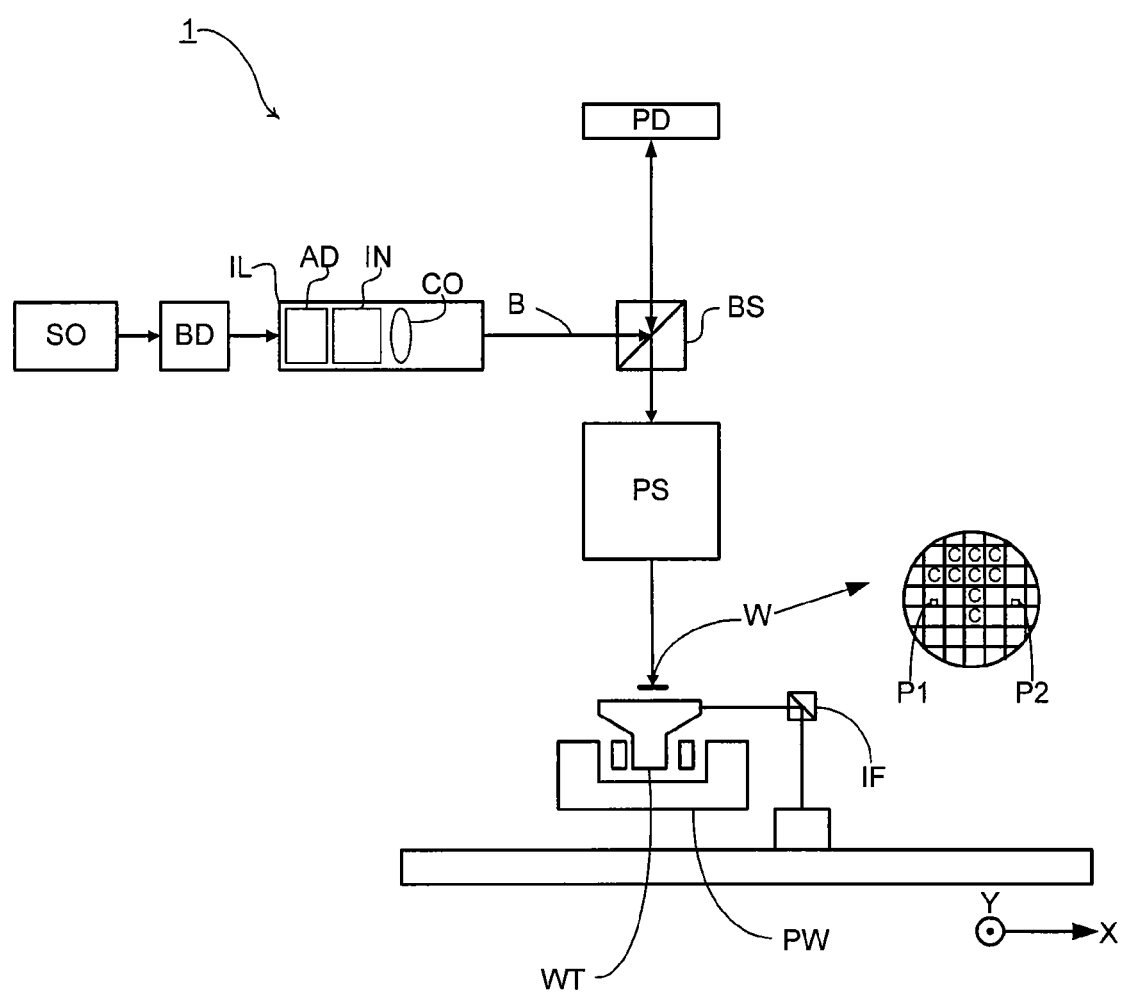
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts the lithographic apparatus 1 of one embodiment of the invention. The apparatus comprises an illumination system IL, a patterning device PD, a substrate table WT, and a projection system PS. The illumination system (illuminator) IL is configured to condition a radiation beam B (e.g., UV radiation).

It is to be appreciated that, although the description is directed to lithography, the patterned device PD can be formed in a display system (e.g., in a LCD television or projector), without departing from the scope of the present invention. Thus, the projected patterned beam can be projected onto many different types of objects, e.g., substrates, display devices, etc.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The illumination system can include various types of optical components, such as refractive, reflective, magnetic, electromagnetic, electrostatic or other types of optical components, or any combination thereof, for directing, shaping, or controlling radiation.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam cannot exactly correspond to the desired pattern in the target portion of the substrate, for example if the pattern includes phase-shifting features or so called assist features. Similarly, the pattern eventually generated on the substrate cannot correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." The patterning device comprises at least 10, at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is composed of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction than unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In one example, such as the embodiment depicted in FIG. 1, the substrate W has a substantially circular shape, optionally with a notch and/or a flattened edge along part of its perimeter. In another example, the substrate has a polygonal shape, e.g., a rectangular shape.

Examples where the substrate has a substantially circular shape include examples where the substrate has a diameter of at least 25 mm, at least 50 mm, at least 75 mm, at least 100 mm, at least 125 mm, at least 150 mm, at least 175 mm, at least 200 mm, at least 250 mm, or at least 300 mm. Alternatively, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, at least 2 sides or at least 3 sides, of the substrate has a length of at least 5 cm, at least 25 cm, at least 50 cm, at least 100 cm, at least 150 cm, at least 200 cm, or at least 250 cm.

At least one side of the substrate has a length of at most 1000 cm, at most 750 cm, at most 500 cm, at most 350 cm, at most 250 cm, at most 150 cm, or at most 75 cm.

In one example, the substrate W is a wafer, for instance a semiconductor wafer. The wafer material can be selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend on the substrate material and/or the substrate dimensions. The thickness can be at least 50 μm, at least 100 μm, at least 200 μm, at least 300 μm, at least 400 μm, at least 500 μm, or at least 600 μm. Alternatively, the thickness of the substrate can be at most 5000 μm, at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array to form the secondary sources and to image spots onto the substrate. The array of focusing elements (e.g., MLA) comprises at least 10 focus elements, at least 100 focus elements, at least 1,000 focus elements, at least 10,000 focus elements, at least 100,000 focus elements, or at least 1,000,000 focus elements.

The number of individually controllable elements in the patterning device is equal to or greater than the number of focusing elements in the array of focusing elements. One or more (e.g., 1,000 or more, the majority, or each) of the focusing elements in the array of focusing elements can be optically associated with one or more of the individually controllable elements in the array of individually controllable elements, with 2 or more, 3 or more, 5 or more, 10 or more, 20 or more, 25 or more, 35 or more, or 50 or more of the individually controllable elements in the array of individually controllable elements.

The MLA can be movable (e.g., with the use of one or more actuators) at least in the direction to and away from the substrate. Being able to move the MLA to and away from the substrate allows, e.g., for focus adjustment without having to move the substrate.

Figure 2:
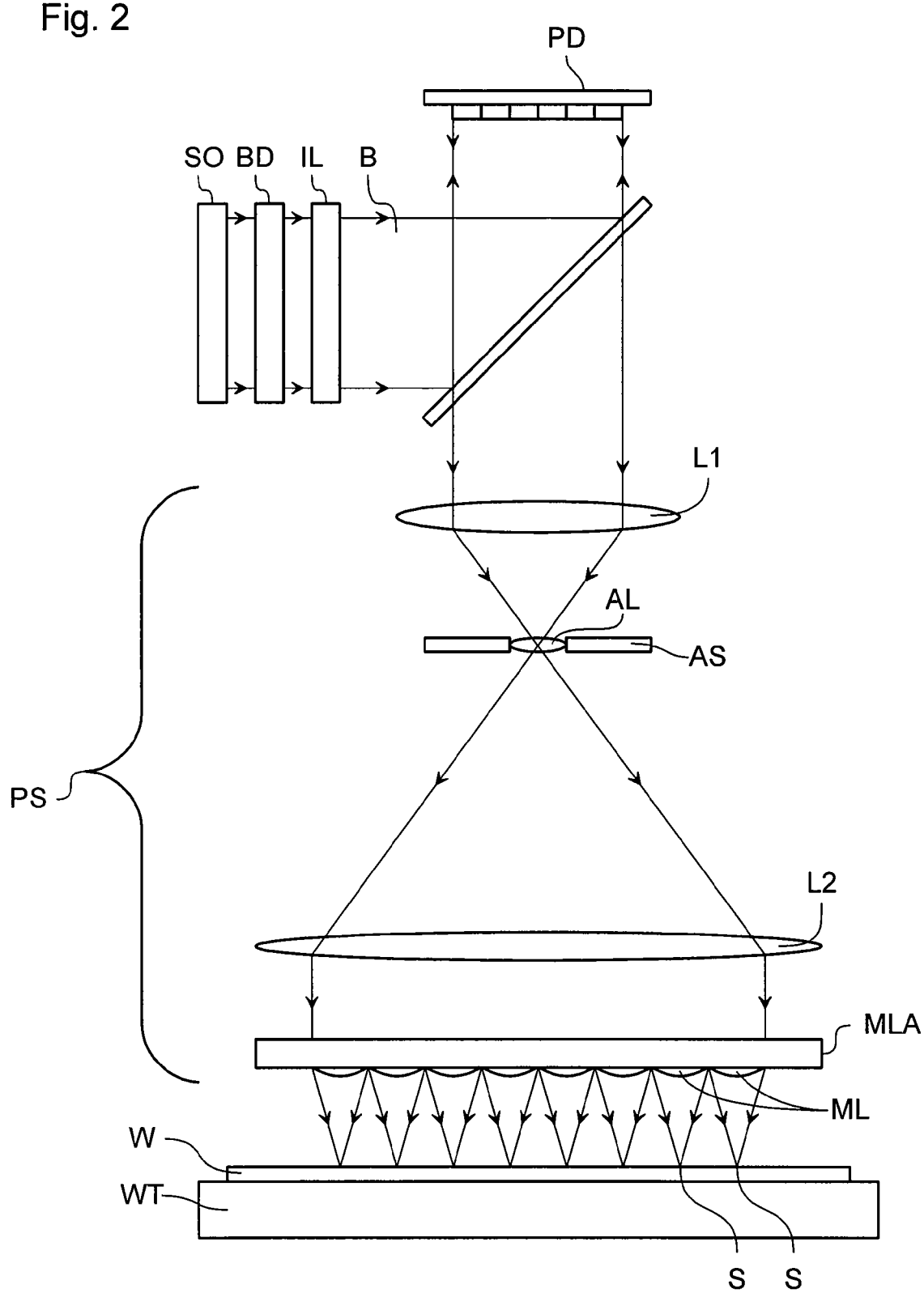

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. The radiation source provides radiation having a wavelength of at least 5 nm, at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. Alternatively, the radiation provided by radiation source SO has a wavelength of at most 450 nm, at most 425 nm, at most 375 nm, at most 360 nm, at most 325 nm, at most 275 nm, at most 250 nm, at most 225 nm, at most 200 nm, or at most 175 nm. The radiation can have a wavelength including 436 nm, 405 nm, 365 nm, 355 nm, 248 nm, 193 nm, 157 nm, and/or 126 nm.

The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage cannot be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. The beam of radiation can be directed at the patterning device at an angle between 0 and 90°, between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 cannot be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). At least 3, at least 4 radiation intensity values, at least 8 radiation intensity values, at least 16 radiation intensity values, at least 32 radiation intensity values, at least 64 radiation intensity values, at least 128 radiation intensity values, or at least 256 different radiation intensity values can be projected onto the substrate.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. The radiation dose profile can have at least 2 desired dose levels, at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses ML in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
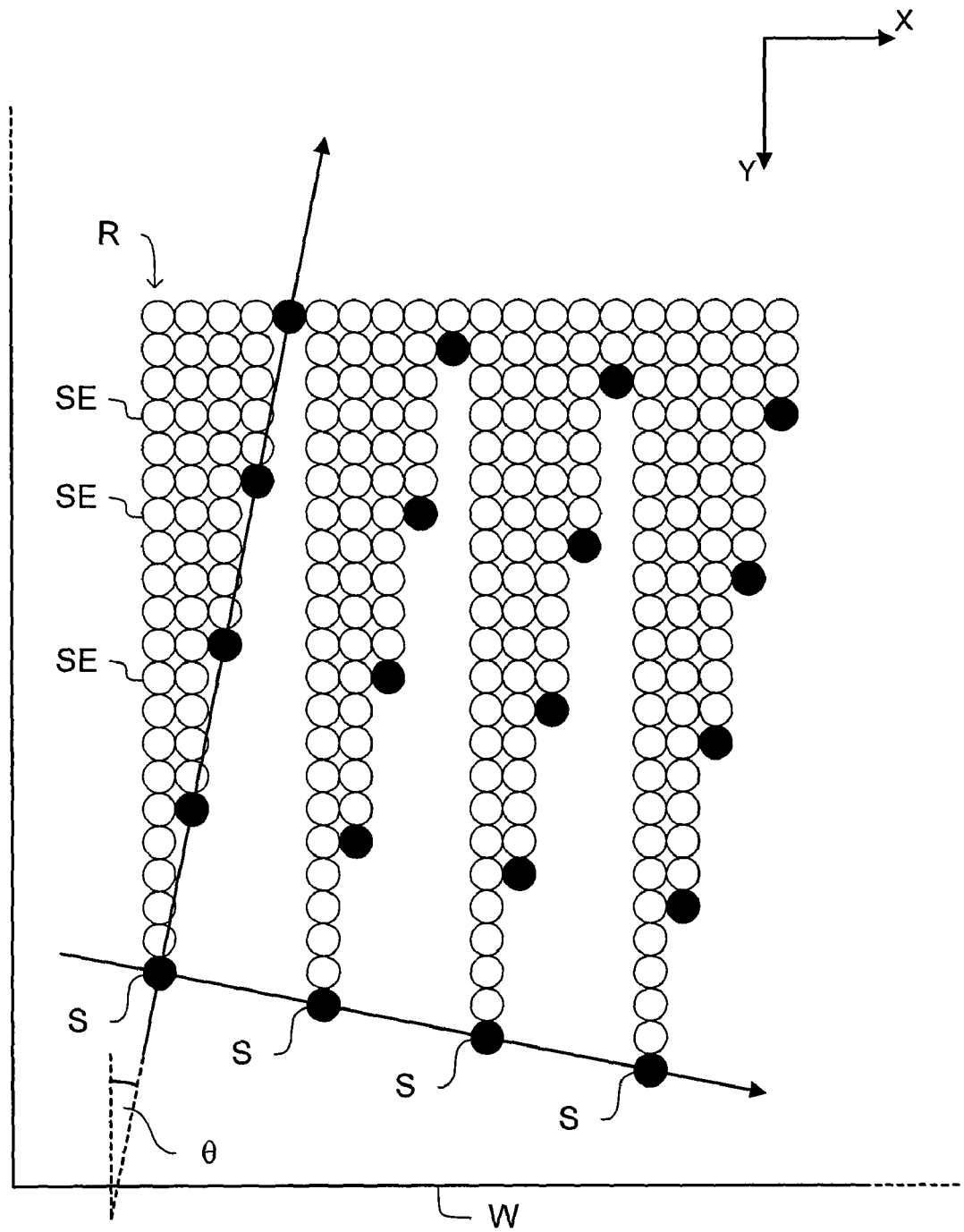
FIG. 3 depicts a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. The angle $\theta$ can be at most 20°, at most 10°, at most 5°, at most 3°, at most 1°, at most 0.5°, at most 0.25°, at most 0.10°, at most 0.05°, or at most 0.01°. Alternatively, the angle $\theta$ is at least 0.001°.

Figure 4:
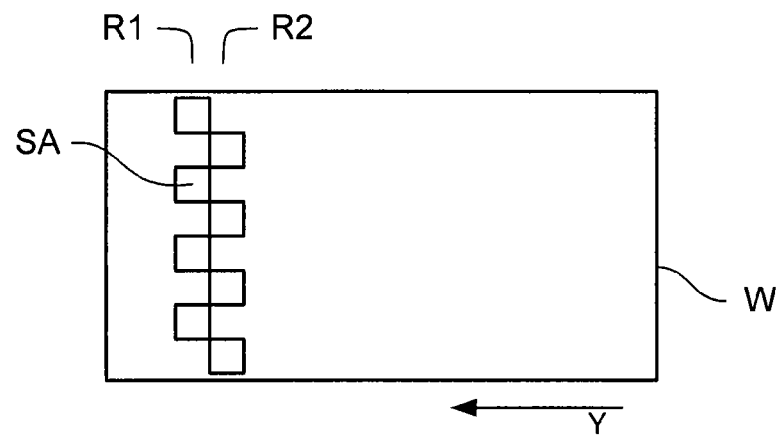
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, at least 2, at least 4, at least 8, at least 10, at least 12, at least 14, or at least 17. Alternatively, the number of optical engines is less than 40, less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
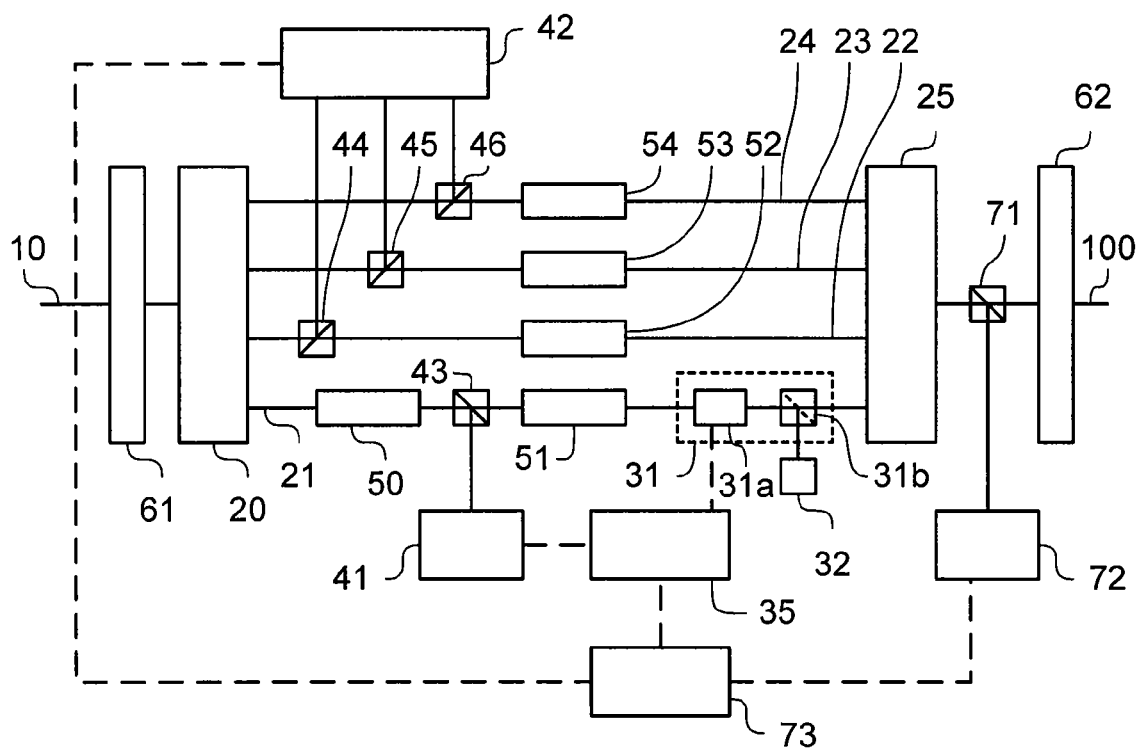
FIG. 5 depicts an arrangement of a radiation beam conditioning system according to an embodiment of the present invention.

FIG. 5 depicts an arrangement of a radiation beam conditioning system according to the present invention. It is arranged to receive an input beam of radiation 10, in particular a pulsed beam of radiation, and to output a conditioned beam of radiation 100. The radiation beam conditioning system includes a radiation beam splitter 20 arranged to divide radiation from the input beam of radiation 10 between at least three optical paths 21,22,23,24. In the arrangement depicted in FIG. 5 there are four optical paths. However, it should be appreciated that a different number of optical paths may be used. The radiation beam conditioning system further includes a radiation beam combiner 25 that re-combines the optical paths 21,22,23,24 to form a single output beam of radiation 100. Accordingly, each pulse of radiation is divided between the optical paths 21,22,23,24 before being re-combined in the radiation beam combiner 25. The radiation beam divider 20 and the radiation beam combiner 25 may be formed from any conventional beam dividers, such as partially reflective surfaces or half-mirrors. Furthermore, when the optical paths are re-combined, they may simply be arranged to propagate adjacent one another before being input into a homogenizing unit, such as a plate homogenizer, to mix the separate beams into a single beam of radiation.

One of the optical paths 21 includes a radiation pulse trimmer 31, configured to trim a section of the portion of an input pulse of radiation that is directed into the first optical path 21. In particular, the pulse of radiation within the first optical path 21 is trimmed by the radiation pulse trimmer 31, such that the total energy within a pulse of radiation output from the radiation beam combiner 25 is substantially at a predetermined level. Accordingly, the radiation beam conditioning system controls the total energy within each pulse in the output beam of radiation 100. However, only the portion of the pulse transmitted through the first optical path 21 passes through the radiation pulse trimmer 31. Accordingly, only this portion of the pulse is subjected to the transmission losses associated with the radiation pulse trimmer 31. This is in contrast with previously proposed systems in which the entirety of a beam of radiation to be conditioned would be passed through the radiation pulse trimmer and, consequently, a greater amount of radiation was lost due to transmission losses.

A further benefit of the arrangement of this embodiment is that a lower total energy of radiation passes through the radiation pulse trimmer 31 and the peak intensity of the radiation is lower. This is beneficial because the working life of the radiation pulse trimmer 31 may be dependent on the energy of radiation pulses transmitted through it and/or the peak intensity of radiation passing through it. Accordingly, a radiation beam conditioning system according to this embodiment may have a longer life and/or be able to operate for longer before requiring maintenance and/or recalibration than the previously proposed systems.

The radiation pulse trimmer 31 may in particular be comprised of a pockels cell 31a and a polarizing filter 31b. The pockels cell 31a contains an electro-optical material that changes the polarization state of radiation by an amount dependent on a voltage applied to the electro-optical material. The polarizing filter 31b filters the radiation from the pulse, depending on the polarization state of the radiation. Accordingly, for example, the greater the voltage applied to the pockels cell 31a, the greater the change of the polarization state of the radiation, and the more radiation is filtered from the first optical path 21 by the polarizing filter 31b. The polarizing filter 31b may, as depicted in FIG. 5, be a polarizing beam splitter, in which case the radiation filtered from the first optical path 21 may be directed to a radiation dump 32. It should be appreciated that the system may be configured in the opposite sense, e.g., such that the greater the voltage applied to the pockels cell 31a, the less the radiation is filtered by the polarizing filter 31b. In any case, the radiation pulse trimmer 31 may be configured to operate in one of two states: a first state, in which it is substantially transmissive to radiation within the first optical path, and a second state, in which it is substantially non-transmissive to radiation within the first optical path. Switching between the two states may be in response to a trim control signal from a radiation pulse trimmer controller 35.

It should be appreciated that the trim control signals may simply be the voltage to be applied to the electro-optical material in the pockels cell 31a. Alternatively, the trim control signal may be a simple logic signal, switching a voltage supply connected to the electro-optical material between an off state and an on state. This may be beneficial because, in order to provide a sufficiently rapid switching speed of the pockels cell 31a, and to ensure that the pockels cell 31a completely switches between the first state and the second state, the voltage applied to the electro-optical material may be relatively high.

The radiation pulse trimmer controller 35 is accordingly configured to determine the appropriate moment to send the trim control signal to the radiation pulse trimmer 31 in order to ensure that the portion of a pulse of radiation within the first optical path 21 is appropriately trimmed to ensure that the pulse of radiation emitted from the radiation beam combiner 25 has the predetermined total energy. In order to do so, in one example the radiation pulse trimmer controller is connected to radiation intensity sensors 41,42 that measure the intensity of the radiation within the optical paths, 21,22,23,24. In the arrangement depicted in FIG. 5, for example, a partial reflector 43 is provided to divert a known proportion of the radiation within the first optical path 21 to a first radiation intensity sensor 41. Accordingly, by measuring the intensity of the radiation detected by the first radiation intensity sensor 41 and using appropriate calibration, it is possible to determine the intensity of the radiation within the first optical path. Likewise, partial reflectors 44,45,46 are provided for each of the other optical paths 22,23,24, diverting known proportions of the radiation from each of those optical paths. In the arrangement depicted in FIG. 5, a second radiation intensity sensor 42 is provided that measures the total intensity of the radiation in each of the optical paths other than the first optical path. However, it should be appreciated that separate radiation intensity sensors may be provided to measure the intensity of the radiation within each of the optical paths.

The radiation pulse trimmer controller 35 is arranged to determine, from the measurements made by the radiation intensity sensors 42, the total energy of the portions of the input pulse of radiation within the optical paths 22,23,24 other than the first optical path 21. For example, the radiation pulse trimmer controller 35 may include an integrator that integrates the radiation intensity detected by the radiation intensity sensor 42 that detects the intensity of the radiation in all of the optical paths 22,23,24 other than the first optical path 21. Accordingly, the radiation pulse trimmer controller 35 may determine the total contribution of the optical path 22,23,24, other than the first optical path 21, to the total energy of a pulse output from the radiation beam combiner 25. From this and the known predetermined value for the desired total radiation dose, the radiation pulse controller 35 may determine the total dose of energy required for the portion of the pulse of radiation transmitted through the first optical path 21, e.g., the difference between the two values.

Therefore, the radiation pulse trimmer controller 35 may provide the trim control signal to the radiation pulse trimmer 31 at the appropriate moment in order to trim a desired portion of the pulse. For example, the radiation pulse trimmer controller 35 may include a second integrator that integrates the radiation intensity of the radiation within the first optical path 21, as measured by the first radiation intensity sensor 41. At a trigger point when the total energy transmitted within the first optical path 21, as determined by the second integrator within the radiation pulse trimmer controller 35, reaches the required difference between the total energy within the other optical paths 22,23,24 and the predetermined energy level required for the pulse, the radiation pulse trimmer controller 35 is triggered to send the trim control signal to the radiation pulse trimmer 31.

In order to provide sufficient time for the radiation pulse trimmer controller 35 to determine the required energy of the portion of the pulse within the first optical path 21, an optical delay 50 may be provided within the first optical path 21 between the radiation beam splitter 20 and the radiation intensity sensor 41.

Furthermore, in order to provide sufficient time for the radiation pulse trimmer controller 35 to determine the point at which the radiation pulse trimmer 31 should be switched to the second state, to provide sufficient time for the necessary control signal to be generated and transmitted to the radiation pulse trimmer 31 and to provide sufficient time for the radiation pulse trimmer 31 to switch from the first state to the second state, a second optical delay 51 may be provided in the first optical path 21, between the radiation intensity sensor 41 and the radiation pulse trimmer 31. It will be appreciated that the arrangement of the timing between these components can be critical. Accordingly, the radiation pulse trimmer controller 35 may include a controllable electronic delay between the point at which it is determined, from the radiation intensity measurements made by the first radiation intensity sensor 41, that the total energy of the portion of the pulse of radiation within the first optical path 21 has reached the required level and the point at which the control signal is transmitted to the radiation pulse trimmer 31. In this way, the extent of the optical delay of the second optical delay 51 may be fixed, but the relative timing of the different components may be adjusted by changing the electronic delay within the radiation pulse trimmer controller 35. This may be especially beneficial because the relative timings may change, for example due to any change in the environment within the radiation beam conditioning system and/or due to variations in the speed of response of the first radiation intensity sensor 41 and the radiation pulse trimmer 31 as these components age.

It will therefore be appreciated that there can also be optical delays built into the first optical path 21. In addition, optical delays 52,53,54 may be included in the optical paths 22,23,24 other than the first optical path 21. All of the optical delays may be provided by any convenient method, such as by increasing the optical pathlength by, for example, arranging the radiation to be reflected several times between a pair of reflective surfaces. The optical delays for each of the optical paths 21,22,23,24 may be selected such that the total pathlength between the radiation beam splitter 20 and the radiation beam combiner 25 for each are set to be different from the others. Accordingly, the portions of the radiation pulse arriving at the radiation beam combiner 25 from each of the optical paths, 21,22,23,24 may be at slightly different times. As a consequence, the radiation pulse output from the radiation beam combiner 25 will inherently have been stretched.

Accordingly, by the provision of an arrangement, such as this embodiment, in which the radiation beam is split into separate optical paths and subject to different processing, the pulse of radiation will be stretched. Therefore, for a given amount of stretching required, fewer units specifically provided to stretch the pulses of radiation may be required, reducing the transmission losses associated with such stretchers. However, as depicted in FIG. 5, additional pulse stretchers 61,62 may in any case be provided in order to reduce interference effects, such as speckle. The pulse stretchers

61,62 may be arranged before the radiation beam splitter 20 and/or after the radiation beam combiner 25.

As depicted in FIG. 5, an output radiation intensity sensor 72 may be provided at the output of the radiation beam combiner 25. For example, as depicted in FIG. 5, it may be configured to measure the intensity of the radiation of a known portion of the output beam of radiation, directed by a partial reflector 71. Accordingly, a system controller 73 may monitor the intensity of the output beam of radiation and, for example, using a further integrator, determine the total energy of pulses of radiation output from the radiation beam combiner 25. Accordingly, the system controller 73 may compare the predetermined level of energy required for a radiation pulse with the actual output radiation pulse energy. Based on these measurements, the system controller 73 may update the calibration and/or settings of one or more of the components within the radiation beam conditioner, such as the electronic delay and the trigger point of the radiation pulse trimmer controller, in order to improve the performance of the radiation beam conditioner for subsequent pulses. In addition, the system controller 73 may determine the predetermined energy level for a pulse of radiation based on, for example, a known radiation dose required at the substrate and the known transmission losses within the remainder of the lithographic apparatus.

It should be appreciated that, although the radiation beam conditioner has been described above as having a radiation pulse trimmer controller 35 and a system controller 73, both controllers may be combined into a single unit or, alternatively, one or more of these units may be divided into separate controller providing separate control functions.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A radiation beam conditioning system, configured to condition a pulsed beam of radiation for use in a lithographic apparatus, the radiation beam conditioning system comprising:

a radiation beam divider configured to divide the pulsed beam of radiation along at least first, second and third optical paths;

a radiation beam combiner configured to re-combine the pulses of radiation from the at least first, second, and third optical paths to form a single output pulsed beam of radiation; and a radiation pulse trimmer configured to the pulse of radiation traveling along the first optical path, wherein the radiation pulse trimmer is configured to trim the pulse of radiation within the first optical path, such that a total amount of energy of the single output pulsed beam of radiation is substantially a predetermined level, and wherein optical path lengths of the first, second and third optical paths, between the radiation beam divider and the radiation beam combiner, are different.

2. The system of claim 1, further comprising:

a radiation pulse trimmer controller configured to produce a trim control signal;

wherein the radiation pulse trimmer is configured to switch from a first state, in which it is substantially transmissive to radiation within the first optical path, to a second state, in which it is substantially non-transmissive to radiation within the first optical path, in response to the trim control; and wherein the radiation pulse trimmer controller is configured to determine when to send the trim control signal, such that the total energy of the single output pulsed beam of radiation is substantially the predetermined level.

3. The system of claim 2, wherein the first optical path is provided with a first optical delay, such that the radiation pulse trimmer controller has determined the difference before the portion of the pulse of radiation within the first optical path is detected by the first radiation sensor.

4. The system of claim 3, wherein:

the first optical path is provided with a second optical delay, such that a time for radiation to pass from the position of the first radiation sensor to the radiation pulse trimmer is substantially equal to:

a time for the radiation pulse trimmer controller to determine an updated total of the energy of the pulse transmitted within the first optical path;

determine if this matches the difference;

provide the trim control signal to the radiation pulse trimmer; and for the radiation pulse trimmer to switch to the second state.

5. The system of claim 1, further comprising:

a first radiation sensor configured to measure an intensity of radiation in the first optical path; and a second radiation sensor configured to measure the intensity of the radiation in the second and third optical paths, wherein the radiation pulse trimmer controller is configured to:
- determine total energy in a portion of the pulse of radiation traveling along the second and third optical paths;
- to determine a difference between the total energy and the predetermined level;
- to monitor an intensity of the radiation traveling along the first optical path during transmission of a portion of the pulse traveling along the first optical path; and
- to send the trim control signal when a total energy of the pulse transmitted along the first optical path is substantially equal to the difference.

6. The system of claim 5, wherein the radiation pulse trimmer controller includes a controllable time delay between determining that the total energy of the pulse transmitted within the first optical path matches the difference and sending the trim control signal.

7. The system of claim 1, wherein a single radiation sensor is configured to measure the total intensity of the radiation in the second and third optical paths.

8. The system of claim 1, further comprising:
separate radiation sensors configured to measure the intensity of the radiation in respective ones of the first, second, and third optical paths.

9. The system of claim 1, further comprising:
a system controller configured to set the predetermined level in response to a radiation dose desired to be provided to a substrate in the lithographic apparatus.

10. The system of claim 9, further comprising:
an output radiation intensity sensor configured to measure an intensity of the single output pulsed beam of radiation;
wherein the system controller is configured to:
determine the total energy of single output pulsed beam of radiation from the measured single output pulsed beam of radiation; and
adjust a calibration or a setting of at least one of the components of the radiation beam conditioning system from a comparison of the determined total energy and the predetermined level.

11. The system of claim 1, wherein the radiation pulse trimmer comprises:
a pockels cell that is configured to change the polarization state of radiation input in to the pockels cell to an extent dependent on a control voltage applied to it; and
a polarizing filter that is configured to transmit radiation to an extent dependent on the polarization state of the radiation.

12. The system of claim 1, wherein the radiation beam divider is configured to divide the pulsed beam of radiation along four optical paths.

13. The system of claim 1, wherein the radiation beam conditioning system comprises at least one radiation pulse stretcher that is configured to stretch the pulses of radiation, each arranged either before the radiation beam divider or after the radiation beam combiner.

14. A lithographic apparatus, comprising:
a radiation beam conditioning system comprising:
a radiation beam divider configured to divide the pulsed beam of radiation along at least first, second and third optical paths;
a radiation beam combiner configured to re-combine the pulses of radiation from the at least first, second, and third optical paths to form a single output pulsed beam of radiation; and
a radiation pulse trimmer configured to the pulse of radiation traveling along the first optical path,
wherein the radiation pulse trimmer is configured to trim the pulse of radiation within the first optical path, such that a total amount of energy of the single output pulsed beam of radiation is substantially a predetermined level, and
wherein optical path lengths of the first, second and third optical paths, between the radiation beam divider and the radiation beam combiner, are different;
a patterning device configured to pattern the single output pulsed beam of radiation; and
a projection system configured to project the patterned beam onto target portions of a substrate.

15. A device manufacturing method for conditioning a pulsed beam of radiation, for use in imaging a pattern onto a substrate; the conditioning comprising:
directing the pulsed beam of radiation along at least first, second and third optical paths;
trimming pulses of radiation within the first optical path; and
re-combining the pulses of radiation from the first, second, and third optical paths to form a single output pulsed beam of radiation;
wherein the pulses of radiation within the first optical path are trimmed such that a total energy of the single output pulsed beam of radiation is substantially a predetermined level; and
wherein optical path lengths of the first, second and third optical paths, between the radiation beam being divided and re-combined, are different.

* * * * *